United States Patent [19]
Hase et al.

[11] Patent Number: 5,905,273
[45] Date of Patent: May 18, 1999

[54] QUANTUM BOX INFORMATION STORAGE DEVICE

[75] Inventors: Ichiro Hase; Toshikazu Suzuki, both of Kanagawa, Japan

[73] Assignee: Sony Corporation, Tokyo, Japan

[21] Appl. No.: 08/988,692

[22] Filed: Dec. 11, 1997

[30] Foreign Application Priority Data

Dec. 12, 1996 [JP] Japan ................................. 8-332493

[51] Int. Cl.$^6$ ................................................. H01L 24/06
[52] U.S. Cl. ........................................... 257/24; 257/192
[58] Field of Search ................................. 257/192, 175, 257/17, 20, 22, 24, 27

[56] References Cited

U.S. PATENT DOCUMENTS 5,198,879  3/1993  Ohshima ............................. 257/17
5,608,231  3/1997  Ugajin et al. ........................ 257/192
5,679,962  10/1997 Kizuki .................................. 257/17

Primary Examiner—David B. Hardy
Attorney, Agent, or Firm—Hill & Simpson

[57] ABSTRACT

An electronic device comprises a conductive region, and a three-dimensional assembly of fine particles in a close relation with the conductive region, the conductive region being controlled in electric conductivity by controlling distribution of electrons in the three-dimensional assembly of fine particles. Another electronic device comprises a conductive region, and a two-dimensional assembly of fine particles in a close relation with the conductive region, the conductive region being controlled in electric conductivity by controlling the state of occupation by electrons in a plurality of quantum levels formed in the fine particles.

16 Claims, 10 Drawing Sheets

QUANTUM BOX INFORMATION STORAGE DEVICE

BACKGROUND OF THE INVENTION

1. Field of the Invention

This invention relates to an electronic device and in particular relates to that using a three-dimensional assembly of fine particles.

2. Description of the Related Art

In recent high-integrated semiconductor memory, approximately $10^4$ electrons stored in capacitors in memory cells for one bit of information. Therefore, in order to write information in semiconductor memory, about $10^4$ electrons must be stored in capacitors in memory cells.

For storing $10^4$ electrons in capacitors in memory cells, since energy of several eV per electron is required, energy as high as $10^4$ eV or more is consumed only for storing one bit of information. That is, the power consumption of conventional semiconductor memory is very large.

OBJECTS AND SUMMARY OF THE INVENTION

It is therefore an object of the invention to provide an electronic device enabling realization of a low-consumption memory device.

A further object of the invention is to provide an electronic device enabling realization of a memory device promising high-speed write and read of information.

A still further object of the invention is to provide an electronic device enabling realization of a memory device capable of storing a plurality of bits of information.

A yet further object of the invention is to provide an electronic device enabling realization of a memory device capable of storing many-value information.

A yet further object of the invention is to provide an electronic device enabling realization of a memory device enabling high integration.

According to a first aspect of the invention, there is provided an electronic device comprising:

a conductive region; and a three-dimensional assembly of fine particles in a close relation with the conductive region, the conductive region being controlled in electric conductivity by controlling distribution of electrons in the three-dimensional assembly of fine particles.

In the first aspect of the invention, the electronic device typically includes a control electrode provided in a close relation with the three-dimensional assembly of fine particles to control distribution of electrons in the three-dimensional assembly of fine particles by applying a voltage to the control electrode.

In the first aspect of the invention, differences in electron distribution in the three-dimensional assembly of fine particles are detected through detection of differences in electric conductivity of the conductive region upon reading information stored in the electron device.

In the first aspect of the invention, the three-dimensional assembly typically comprises a plurality of stacked layers, each layer being a two-dimensional fine-particles array in which fine particles are two-dimensionally arranged in a predetermined pattern in a plane parallel to the interface of the conductive region and the three-dimensional assembly of fine particles. In this case, the distance between fine particles in a direction normal to the interface of the conductive region and the three-dimensional assembly of fine particles may be set to a value permitting electrons to move between the fine particles by quantum-mechanical tunneling, or may be set to a value difficult for electrons to move between the fine particles by quantum-mechanical tunneling. The three-dimensional assembly of fine particles may comprise a plurality of three-dimensional sub-assemblies of fine particles each containing a plurality of two-dimensional fine-particle arrays arranged in a direction normal to the interface of the conductive region and the three-dimensional assembly of fine particles. In this case, the distance between fine particles in a direction normal to the interface of the conductive region and each three-dimensional assembly may be set to a value permitting electrons to move between the particles within each three-dimensional sub-assembly by quantum-mechanical tunneling, and the distance from a peripheral fine particle in a three-dimensional sub-assembly of fine particles to an opposite peripheral fine particle in another three-dimensional sub-assembly of fine particles in a direction normal to the interface of the conductive region and the three-dimensional assembly of fine particles may be set to a value difficult for electrons to move between these fine particles by quantum-mechanical tunneling.

According to a second aspect of the invention, there is provided an electronic device comprising:

a conductive region; and a two-dimensional assembly of fine particles in a close relation with the conductive region, the conductive region being controlled in electric conductivity by controlling the state of occupation by electrons in a plurality of quantum levels formed in the fine particles.

In the second aspect of the invention, the electronic device typically includes a control electrode provided in a close relation with the two-dimensional assembly of fine particles to control states of electrons having different quantum levels by applying a voltage to the control electrode.

In the second aspect of the invention, differences in electron distribution in the two-dimensional assembly of fine particles are detected through detection of differences in electric conductivity of the conductive region upon reading information stored in the electron device.

In the second aspect of the invention, the two-dimensional assembly is designed so that the mean energy difference between different quantum levels, namely, between the ground state and the first excited level or between the first excited level and the second excited level, be larger than kT (where k is the Boltzmann constant, and T is the operation temperature expressed in absolute temperature). More specifically, the mean energy distance is set larger than 26 meV, the value of kT under a room temperature, when the electronic device is operated at the room temperature, but it is sufficient to be not lower than 10 mev when the electronic device is operated at a low temperature, for example, at the liquid nitrogen temperature.

In the present invention, the fine particles may be a semiconductor, such as compound semiconductor, polycrystalline silicon, or the like, or a metal.

The electronic device according to the first aspect of the invention having the above-explained structure can store information in accordance with electron distributions in the three-dimensional assembly of fine articles, and can detect differences in electron distribution through detection of differences in electric conductivity of the conducive region. Therefore, a memory device for writing and reading information can be realized. Power consumption of the memory device is low because the electron distribution in the three-dimensional assembly of fine particles can be readily controlled by applying a voltage. Moreover, since the change in state can be made at a high speed by movements of electrons between fine particles, writing and reading of information can be made at a high speed. Especially when the distance in a direction normal to the interface of the conductive region and the three-dimensional assembly of fine particles from one to another of the fine particles is set to a value difficult for electrons to move between the fine particles by quantum-mechanical tunneling, a plurality of bits of information, as a whole, can be stored by storing one bit of information in each two-dimensional fine-particle array in accordance with the in-plane density of its electrically charged value. Further, the memory device occupies a very small space, and enables highly integration.

The electronic device according to the second aspect of the invention having the above-explained structure can store information in accordance with states of occupation by electrons in a plurality of quantum levels, and can detect differences in state of occupation by electrons through detection of differences in electric conductivity of the conductive region. Therefore, a memory device for writing and reading information can be realized. When two or more quantum levels are used, three-value or more many-value information can be stored. Power consumption of the memory device is low because the state of occupation by electrons in a plurality of quantum levels can be readily controlled by applying a voltage. Moreover, since the change in state of occupation can be induced at a high speed by movements of electrons between fine particles, writing and reading of information can be made at a high speed. Further, the memory device occupies a very small space, and enables high integration.

The above and other objects and features of the present invention will become apparent from the following detailed description and the appended claims with reference to the accompanying drawings.

DETAILED DESCRIPTION OF THE PREFERRED EMBODIMENTS

Figure 1:
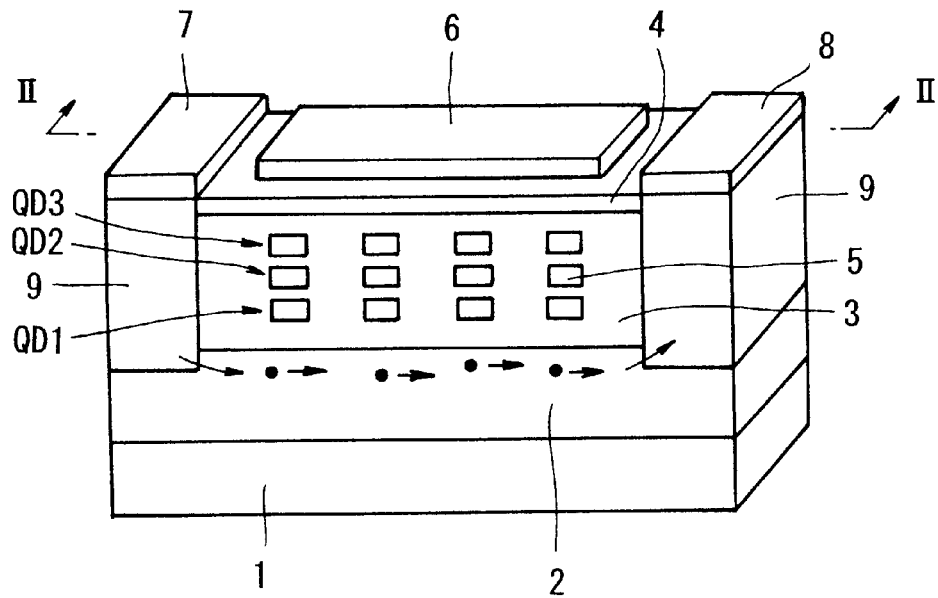
FIG. 1 is a perspective view of a field effect transistor according to a first embodiment of the invention.

Some embodiments of the invention are described below with reference to the drawings. In all of the drawings showing embodiments of the invention, common or equivalent elements are labelled with common reference numerals.

Figure 2:
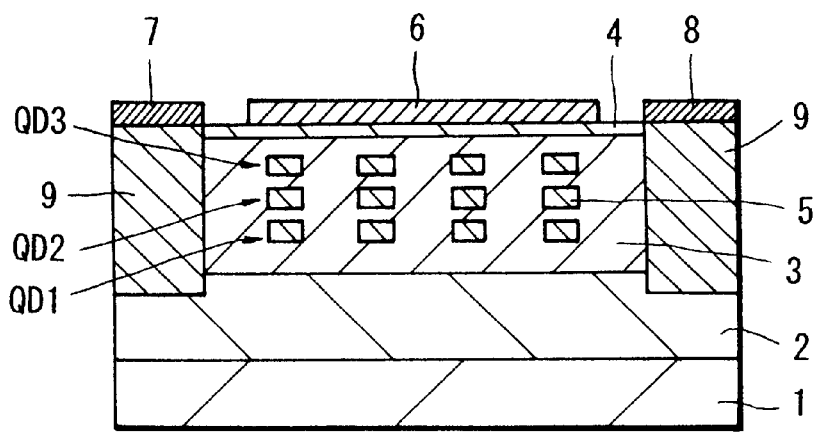
FIG. 2 is a cross-sectional view taken along the II—II line of FIG. 1.

FIG. 1 is a perspective view of a field effect transistor according to the first embodiment of the invention, and FIG. 2 is a cross-sectional view taken along the II—II line of FIG. 1.

As shown in FIGS. 1 and 2, in the field effect transistor according to the first embodiment, sequentially stacked on a semi-insulating GaAs substrate 1 are a GaAs layer 2, preferably via a buffer layer, an AlGaAs layer 3 and a GaAs layer 4, which all are undoped, for example. The GaAs layer 2 is used as a conductive region, namely, a channel layer. The GaAs cap layer 4 is used to prevent oxidization of the AlGaAs layer 3.

The AlGaAs layer 3 incudes, in its first, second and third planes parallel to the hetero interface between the GaAs layer 2 and the AlGaAs layer 3, a first-stage two-dimensional quantum dot array of quantum dots QD1, second-stage two-dimensional quantum dot array of quantum dots QD2 and third-stage two-dimensional quantum dot array of quantum dots QD3, respectively, which are embedded in a common alignment pattern. These three-stage two-dimensional quantum dot arrays form a three-dimensional quantum dot array. Each of the quantum dots QD1, QD2 and QD3 has a AlGaAs/InAs heterojunction structure in which an InAs layer 5 in form of a fine particle behaving as a quantum well portion is surrounded by the AlGaAs layer 3 as a barrier layer.

In this case, the distance in a direction normal to the hetero interface of the GaAs layer 2 and the AlGaAs layer 3 from one to another of the first-stage quantum dots QD1, second-stage quantum dots QD2 and third-stage quantum dots QD3 is set small enough, for example, 10 nm or less, to permit electrons to move between them by quantum-mechanical tunneling. The size of each quantum dot QD1, QD2 or QD3 is determined appropriately, depending upon the intended use of the field effect transistor.

A gate electrode 6 made of Al, for example, is provided on the GaAs cap layer 4 just above the three-dimensional quantum dot array embedded in the AlGaAs layer 3 to be in Schottky contact with the GaAs layer 4. Formed on the GaAs cap layer 4 are a source electrode 7 and a drain electrode 8, made of Au/AuGe/Ni, for example, to confront with each other from opposite sides of the gate electrode 6. Further formed in the GaAs cap layer 4, AlGaAs layer 3 and GaAs layer 2 below the source electrode 7 and the drain electrode 8 are alloy layers 9 which make-alloys with metals of the source electrode 7 and the drain electrode 8, respectively.

Next explained are operations of the field effect transistor according to the invention having the above-explained structure.

Figure 3:
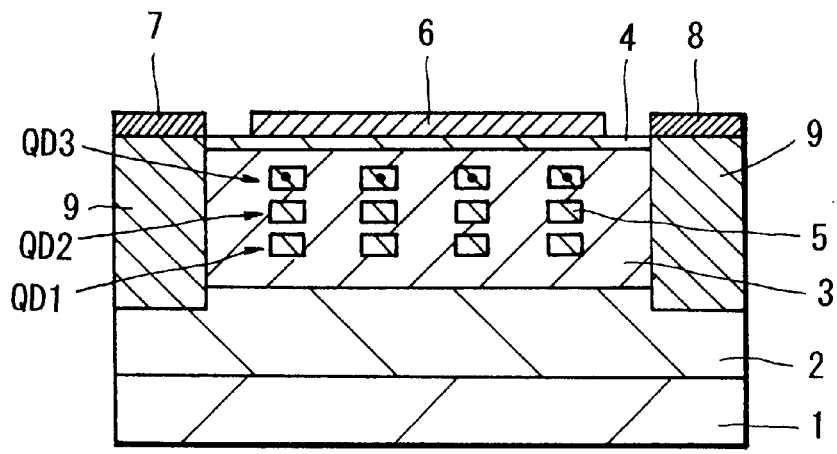
FIG. 3 is a cross-sectional view for explaining operations of the field effect !, according to the first embodiment of the invention.
Figure 4:
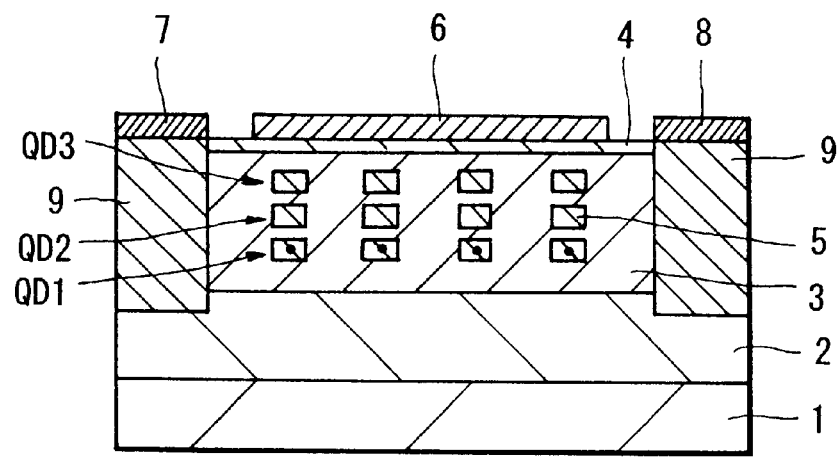
FIG. 4 is a cross-sectional view for explaining operations of the field effect transistor according to the first embodiment of the invention.

When a positive voltage relative to the source electrode 7 is applied to the gate electrode 6, an electric field generated vertically downward in FIG. 2 causes electrons in the three-dimensional quantum dot array to move into quantum dots QD3 of the third-stage two-dimensional dot array nearest to the gate electrode 6. This aspect is shown in FIG. 3. In FIG. 3, black points represent electrons (also in subsequent figures). In contrast, when a negative voltage relative to the source electrode 7 is applied to the gate electrode 6, an electric field generated vertically upward in FIG. 2 causes electrons in the three-dimensional quantum dot array to move into quantum dots QD1 in the first-stage quantum dot array nearest to the GaAs layer 2 behaving as the channel layer. This aspect is shown in FIG. 4. Movements of electrons between quantum dots QD1 of the first-stage quantum dot array and quantum dots QD3 of the third-stage quantum dot array progress via quantum dots QD2 of the second-stage quantum dot array.

In this manner, by selecting a voltage applied to the gate electrode 6, electrons in the entire three-dimensional quantum dot array can be moved to the first-stage two-dimensional quantum dot array nearest to the GaAs layer 2 or to the third-stage two-dimensional quantum dot array nearest to the gate electrode 6 so as to change distribution of electrons.

Therefore, by determining the state with electrons in quantum dots QD3 of the third-stage two-dimensional quantum dot array (FIG. 3) and the state with electrons in quantum dots QD1 in the first-stage two-dimensional quantum dot array (FIG. 4) as bits "1" and "0", one bit of information can be stored.

Depending upon the bit being "1" or "0", the electric conductivity σ in the GaAs channel layer 2 or the threshold voltage Vth of the field effect transistor differs. More specifically, if the electric conductivity is σ1 and the threshold voltage is Vth1 when the bit is "1", and the electric conductivity is σ0 and the threshold voltage is Vth0 when the bit is "0", then σ1>σ0 and Vth1>Vth0.

Reading of stored information can be done by detecting the difference in electric conductivity of the GaAs channel layer 2 or the difference in threshold voltage Vth.

The field effect transistor according to the first embodiment having the above-explained structure can be manufactured as follows.

Figure 5A:
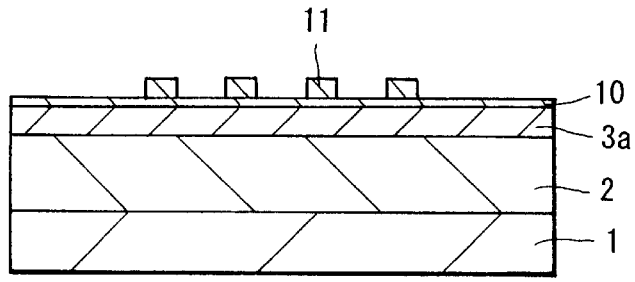
FIGS. 5A through 5D are cross-sectional views for explaining a method for manufacturing the field effect transistor according to the first embodiment of the invention.

As shown in FIG. 5A, first grown on the semi-insulating GaAs substrate 1 are, in sequence, via a buffer layer (not shown), if necessary, an AlGaAs layer 3a of a thickness $d_1$ and an InAs layer of an n1 atom layer by molecular beam epitaxy (MBE) or metal organic chemical vapor deposition (MOCVD), for example. When n1 in the InAs layer with the n1 atom layer is set larger than 1, after an InAs single atom layer 10 grows on the AlGaAs layer 3a during growth of the InAs layer, InAs fine particles are automatically formed thereon to make a predetermined two-dimensional pattern. For example, when n1=1.5, InAs fine particles 11 are automatically formed in a density on the order of $10^{10}$ cm$^{-2}$. The InAs single atom layer 10 behaves as a wet layer for the base body.

Figure 5B:
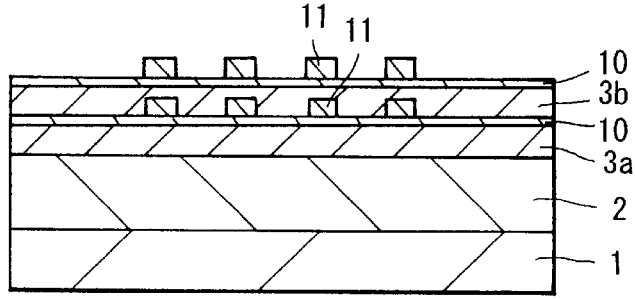

After that, as shown in FIG. 5B, an AlGaAs layer 3b is grown to cover the InAs fine particles 11, and an InAs layer is of an n2 atom layer larger than 1 is grown on the AlGaAs layer 3b. Here again, as to growth of the InAs layer, InAs fine particles 11 are automatically formed on the AlGaAs layer 3b via the InAs single atom layer 10. It is known that the second-stage InAs fine particles 11 are automatically formed in alignment with the first-stage InAs fine particles 11 previously made (Phys. Rev. Lett., 76,952(1996).

Figure 5C:
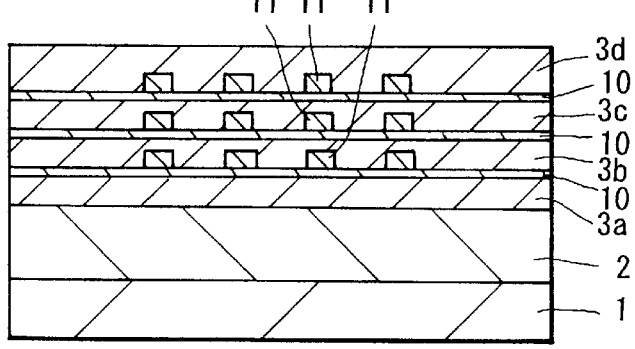

After that, as shown in FIG. 5C, another AlGaAs layer 3c is grown to cover the second-stage InAs fine particles 11, and another InAs layer of an n3 atom layer larger than 1 is grown on the AlGaAs layer 3c. Here again, as to growth of the InAs layer, third-stage InAs fine particles 11 are automatically formed on the AlGaAs layer 3c via an InAs single atom layer 10 in alignment with the second-stage InAs fine particles 11. Thereafter, another AlGaAs layer 3d is grown to cover the third-stage InAs fine particles 11.

As a result, there is obtained the structure in which a three-dimensional assembly of InAs fine particles embedded in the entirety of the AlGaAs layers 3a, 3b, 3c and 3d.

Figure 5D:
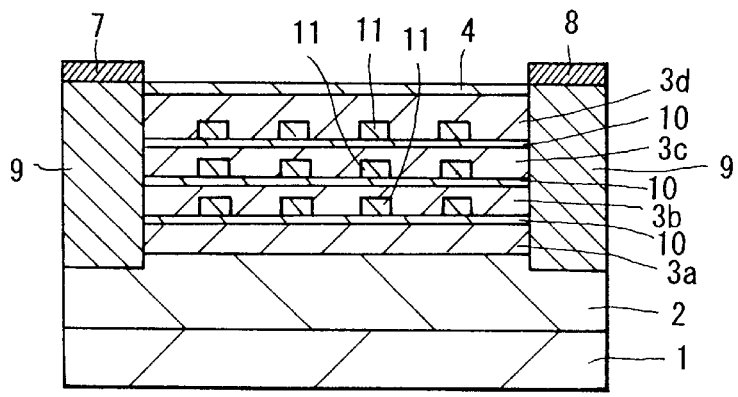

After that, as shown in FIG. 5D, the GaAs cap layer is grown on the AlGaAs layer 3d. Then, a Au/AuGe/Ni film, for example, as a metal film for making the source electrode and the drain electrode is formed on the entire surface of the GaAs ca layer 4 by vacuum evaporation or sputtering, and a resist pattern is formed on the metal film by photolithography or electron beam lithography. Using the resist pattern as a mask, the Au/AuGe/Ni film is etched to form the source electrode 7 and the drain electrode 8. Subsequently, after the resist pattern is removed, the product is annealed at a temperature around 400° C., for example, so that the source electrode 7 and the drain electrode 8 make alloy layers 9 with the underlying GaAs cap layer 4, AlGaAs layers 3a, 3b, 3c, 3d, InAs single atom layer 11 and GaAs layer 2. After that, an Al film, for example, as a metal layer for making the gate electrode is formed on the entire surface by vacuum evaporation or sputtering, for example, and a resist pattern is formed on the metal film by photolithography or electron beam lithography. Using the resist pattern as a mask, the Al film is etched to form the gate electrode 6.

Through these steps, the field effect transistor having substantially the same structure as those of FIGS. 1 and 2 is obtained.

As explained above, since the field effect transistor according to the first embodiment can control the electron distribution in the three-dimensional dot array in a close relationship with the GaAs channel layer 3, it can store one bit of information by determining the state with electrons in quantum dots QD3 in the third-stage two-dimensional quantum dot array nearest to the gate electrode (FIG. 3) and the state with electrons in quantum dots QD1 in the first-stage two-dimensional quantum dot array nearest to the GaAs layer 2 (FIG. 4) as bits "1" and "0", and permits the information to be read through detection of a difference in electric conductivity of he GaAs layer 2 or a difference in threshold voltage Vth. That is, the field effect transistor according to the first embodiment can be used as a memory device. Since this memory device can cause changes in state, namely, changes in electron distribution in the three-dimensional quantum dot array, by applying a low voltage to the gate electrode 6, its power consumption is low. Moreover, since changes in state can be created by movements of electrons between quantum dots QD1 of the first-stage two-dimensional quantum dot array and quantum dots QD3 in the third-stage two-dimensional quantum dot array, the memory device promises high speed writing and reading of information. Further, since the memory device occupies only a small space per unit, it can be readily high-integrated, and can readily make large-capacity memory.

Figure 6:
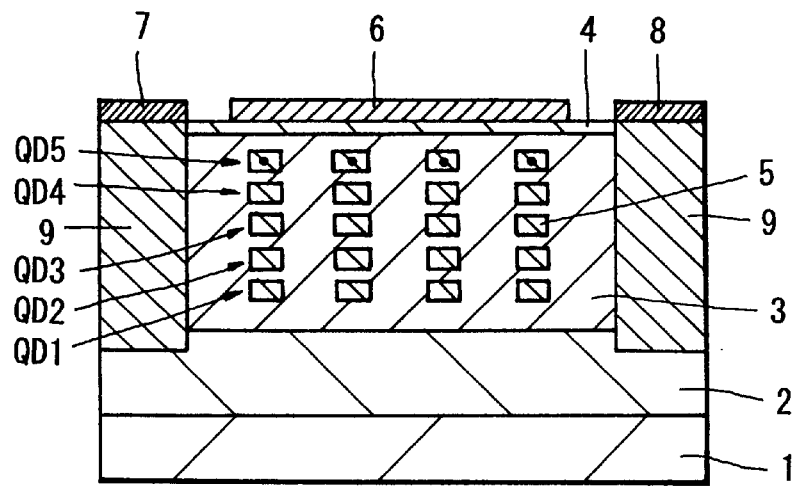
FIG. 6 is a cross-sectional view of a field effect transistor according to a second embodiment of the invention.

FIG. 6 shows a field effect transistor according to the second embodiment of the invention.

As shown in FIG. 6, in the field effect transistor according to the second embodiment, the AlGaAs layer 3 includes, in its first, second, third, fourth and fifth planes parallel to the hetero interface between the GaAs layer 2 and the AlGaAs layer 3, a first-stage two-dimensional quantum dot array of quantum dots QD1, second-stage two-dimensional quantum dot array of quantum dots QD2, third-stage two-dimensional quantum dot array of quantum dots QD3, fourth-stage two-dimensional quantum dot array of quantum dots QD4 and fifth-stage two-dimensional quantum dot array of quantum dots QD5, respectively, which are embedded in a common alignment pattern. These five-stage two-dimensional quantum dot arrays form a three-dimensional quantum dot array. Each of the quantum dots QD1, QD2, QD3, QD4 and QD5 has a AlGaAs/InAs heterojunction structure in which an InAs layer 5 in form of a fine particle behaving as a quantum well portion is surrounded by the AlGaAs layer 3 as a barrier layer. The distance in a direction normal to the hetero interface between the GaAs layer 2 and the AlGaAs layer 3 from one to another of the first-stage quantum dot QD1, second-stage quantum dot QD2, third-stage quantum dot QD3, fourth-stage quantum dot QD4 and fifth-stage quantum dot QD5, in a direction normal to the hetero interface of the GaAs layer 2 and the AlGaAs layer 3 is set small enough, for example, 10 nm or less, to permit electrons to move between them by quantum-mechanical tunneling. In the other respects, the transistor according to the second embodiment is the same as the field effect transistor according to the first embodiment, and explanation thereof is omitted here.

Figure 7:
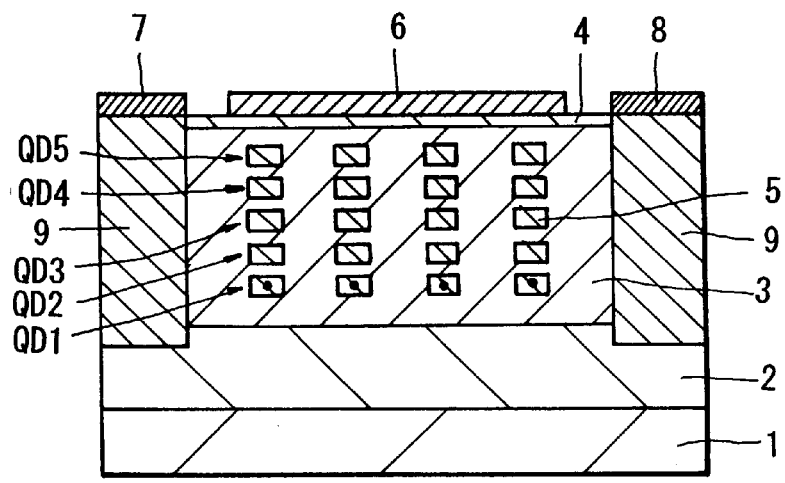
FIG. 7 is a cross-sectional view for explaining operations of the field effect transistor according to the second embodiment of the invention.

For operation of the field effect transistor according to the second embodiment, when a positive voltage relative to the source electrode 7 is applied to the gate electrode 6, electrons in the three-dimensional quantum dot array move into quantum dots QD5 of the fifth-stage two-dimensional quantum do array nearest to the gate electrode 6 (FIG. 6). In contrast, when a negative voltage relative to the source electrode 7 is applied to the gate electrode 6, electrons in the three-dimensional quantum dot array move into first-stage quantum dots QD1 nearest to the GaAs layer 2 (FIG. 7). By determining these different states as bits "1" and "0", one bit of information is stored. In the other respects, the field effect transistor according to the second embodiment behaves in the same manner as that of the first embodiment.

The field effect transistor according to the second embodiment can be fabricated in the same process as that of the first embodiment.

The second embodiment attains the same advantages as those of the first embodiment.

Figure 8:
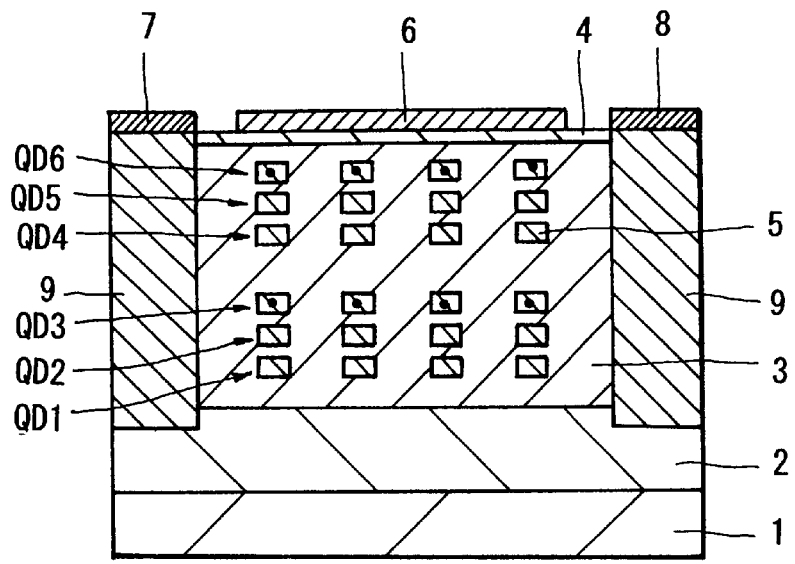
FIG. 8 is a cross-sectional view of a field effect transistor according to a third embodiment of the invention.

FIG. 8 shows a field effect transistor according to the third embodiment.

As shown in FIG. 8, in the field effect transistor according to the third embodiment, the AlGaAs layer 3 includes, in its first, second, third, fourth, fifth and sixth planes parallel to the hetero interface between the GaAs layer 2 and the AlGaAs layer 3, a first-stage two-dimensional quantum dot array of quantum dots QD1, second-stage two-dimensional quantum dot array of quantum dots QD2, third-stage two-dimensional quantum dot array of quantum dots QD3, fourth-stage two-dimensional quantum dot array of quantum dots QD4, fifth-stage two-dimensional quantum dot array of quantum dots QD5 and sixth-stage two-dimensional quantum dot array of quantum dots QD6, respectively, which are embedded in a common alignment pattern. These six-stage two-dimensional quantum dot arrays form a three-dimensional quantum dot array. Each of the quantum dots QD1, QD2, QD3, QD4, QD5 and QD6 has a AlGaAs/InAs heterojunction structure in which an InAs layer 5 in form of a fine particle behaving as a quantum well portion is surrounded by the AlGaAs layer 3 as a barrier layer. The distance in a direction normal to the hetero interface of the GaAs layer 2 and the AlGaas layer 3 from one to another of the first-stage quantum dots QD1, second-stage quantum dots QD2 and third-stage quantum dots QD3 is set small enough to permit electrons to move between them by quantum-mechanical tunneling, and the distance between from one to another of the fourth-stage quantum dots QD4, fifth-stage quantum dots QD5 and sixth-stage quantum dots QD6 is similarly set small enough, for example, 10 nm or less, to permit electrons to move between them by quantum-mechanical tunneling. In contrast, the distance from third-stage quantum dots QD3 and fourth-stage quantum dots QD4 is set to a large value, for example, 10 nm or more, which makes it difficult for electrons to move between them by quantum-mechanical tunneling. In the other structural respects, the field effect transistor taken here is the same as that of the first embodiment, and explanation thereof is omitted here.

Next explained are behaviors of the field effect transistor according to the third embodiment.

Figure 9:
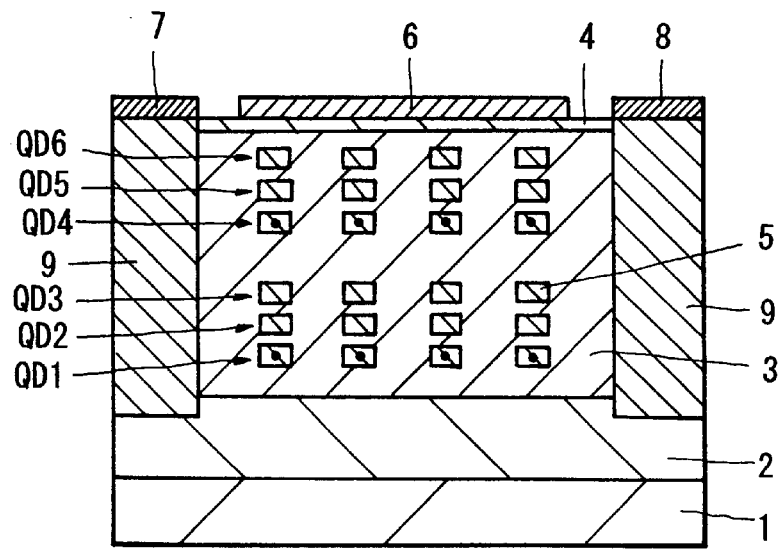
FIG. 9 is a cross-sectional view for explaining operations of the field effect transistor according to the third embodiment of the invention.

When a positive voltage relative to the source electrode 7 is applied to the gate electrode 6, electrons in the first-stage two-dimensional quantum dot array, second-stage two-dimensional quantum dot array and third-stage two-dimensional quantum dot array move into quantum dots QD3 in the third-stage two-dimensional quantum dot array nearest to the gate electrode 6, and electrons in the fourth-stage two-dimensional quantum dot array, fifth-stage twodimensional quantum dot array and fifth-stage two-dimensional quantum dot array move into quantum dots QD6 in the sixth-stage two-dimensional quantum dot array nearest to the gate electrode 6 (FIG. 8). In contrast, when a negative voltage relative to the source electrode 7 is applied to the gate electrode 6, electrons in the first-stage two-dimensional quantum dot array, second-stage two-dimensional quantum dot array and third-stage two-dimensional quantum dot array move into quantum dots QD1 in the first-stage two-dimensional quantum dot array nearest to the GaAs layer 2, and electrons in the fourth-stage two-dimensional quantum dot array, fifth-stage two-dimensional quantum dot array and fifth-stage two-dimensional quantum dot array move into quantum dots QD4 in the fourth-stage two-dimensional quantum dot array nearest to the GaAs layer 2 (FIG. 9). By determining these different states as bits "1" and "0", one bit of information is stored. In the other respects, the field effect transistor according to the third embodiment behaves in the same manner as that of the first embodiment.

The field effect transistor according to the third embodiment can be manufactured in the same process as that of the first embodiment.

The third embodiment provides the same advantages as those of the first embodiment.

Figure 10:
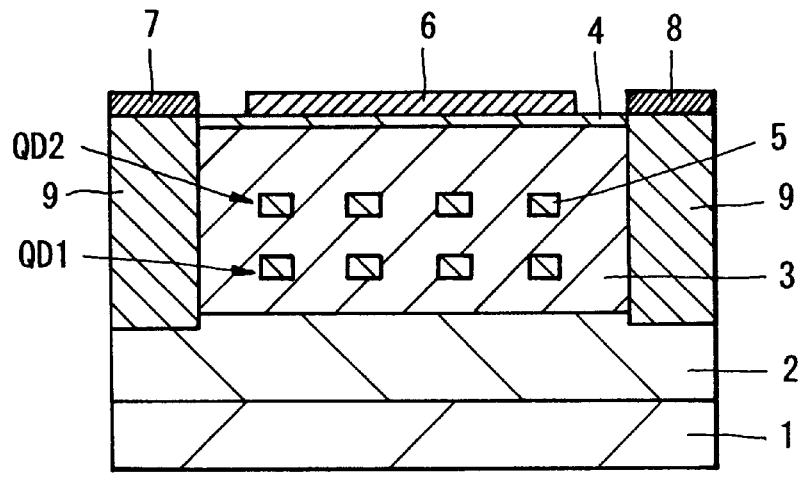
FIG. 10 is a cross-sectional view of a field effect transistor according to a fourth embodiment of the invention.

FIG. 10 shows a field effect transistor according to the fourth embodiment of the invention.

As shown in FIG. 10, in the field effect transistor according to the fourth embodiment, the AlGaAs layer 3 includes, in its first and second planes parallel to the hetero interface between the GaAs layer 2 and the AlGaAs layer 3, a first-stage two-dimensional quantum dot array of quantum dots QD1 and a second-stage two-dimensional quantum dot array of quantum dots QD2, which are embedded in a common alignment pattern. These two-stage two-dimensional quantum dot arrays form a three-dimensional quantum dot array. Each of the quantum dots QD1 and QD2 has a AlGaAs/InAs heterojunction structure in which an InAs layer 5 in form of a fine particle behaving as a quantum well portion is surrounded by the AlGaAs layer 3 as a barrier layer. The distance between quantum dots in different adjacent stages, namely, first-stage quantum dot QD1, second-stage quantum dot QD2, third-stage quantum dot QD3, fourth-stage quantum dot QD4 and fifth-stage quantum dot QD5, in a direction normal to the hetero interface of the GaAs layer 2 and the AlGaAs layer 3, is set large enough, for example, 10 nm or more, to disturb movements of electrons between them by quantum-mechanical tunneling. In the other structural respects, the transistor according to the fourth embodiment is the same as the field effect transistor according to the first embodiment, and explanation thereof is omitted here.

Next explained are behaviors of the field effect transistor according to the fourth embodiment.

The field effect transistor according to the fourth embodiment can store one bit of information by identifying as "1" and "0" whether the difference in in-plane density of the electrically charged value of the first-stage two-dimensional dot array is Q>Q1 or Q<Q2 (where Q1>Q2), one bit of information can be stored. Similarly, by determining as "1" and "0" whether the difference in in-plane density of the electrically charged value of the second-stage two-dimensional dot array is Q>Q1 or Q<Q2 (where Q1>Q2), one bit of information can be stored. That is, the field effect transistor can store one bit of information in the first-stage two-dimensional quantum dot array and another bit of information in the second-stage two-dimensional quantum dot array, and therefore can store two bits of information in the entirety of the three-dimensional quantum dot array including two stages of two-dimensional quantum dot arrays.

Figure 11:
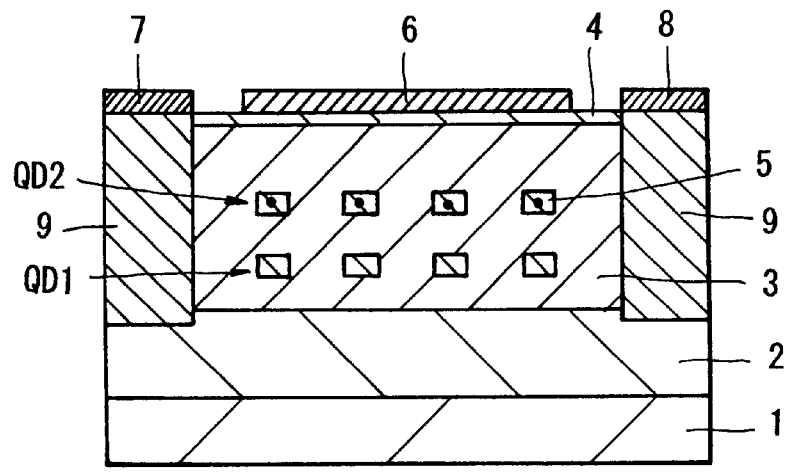
FIG. 11 is a cross-sectional view for explaining operations of the field effect transistor according to the fourth embodiment of the invention.
Figure 12:
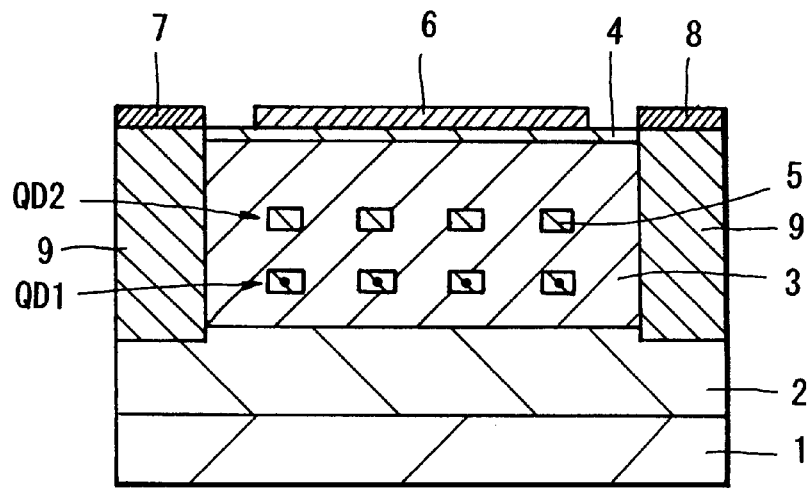
FIG. 12 is a cross-sectional view for explaining operation of the field effect transistor according to the fourth embodiment of the invention.
Figure 13:
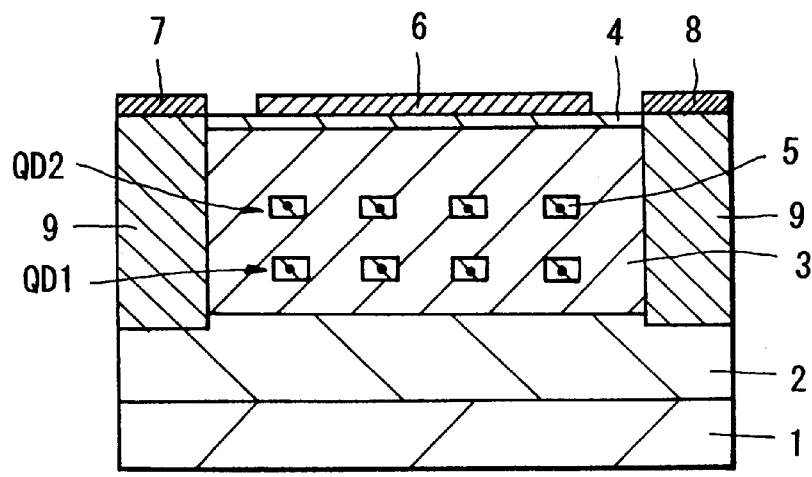
FIG. 13 is a cross-sectional view for explaining operation of the field effect transistor according to the fourth embodiment of the invention.

More specifically, by determining the state where Q<Q2 in both the first-stage and second-stage two-dimensional quantum dot arrays (FIG. 10) as <0, 0>, the state where Q<Q2 in the first-stage two-dimensional dot array and Q>Q1 in the second-stage two-dimensional quantum dot array (FIG. 11) as <1, 0>, the state where Q>Q1 in the first-stage two-dimensional quantum dot array and Q<Q2 in the second-stage two-dimensional quantum dot array (FIG. 12) as <0. 1>, and the state where Q>Q1 in both the first-stage and second-stage two-dimensional quantum dot arrays (FIG. 13) as <1, 1>, two bits of information can be stored.

The electric conductivity σ of the GaAs channel layer 2 or the threshold voltage Vth of the field effect transistor changes, depending on whether the stored two-bit information is <0, 0>, <1, 0>, <0, 1> or <1, 1>. More specifically, if electric conductivities responsive to <0, 0>, <1, 0>, <0, 1> and <1, 1> are σ3, σ2, σ1, σ0, and threshold voltages are Vth3, Vth2, Vth1 and Vth0, then σ3>σ2>σ1>σ0 and Vth3<Vth2<Vth1<Vth0 are established.

The stored information can be read out by detecting differences in electric conductivity σ of the GaAs channel layer 2 or differences in threshold voltage Vth.

Storage of electric charge in quantum dots QD1 and QD2 of the three-dimensional quantum dot array may be done by applying a voltage to the gate electrode 6 to inject electrons from the GaAs channel layer 2 into quantum dots QD1 and QD2.

The field effect transistor according to the fourth embodiment can be fabricated in the same process as that of the first embodiment.

According to the fourth embodiment, a memory device capable of storing two-bit information can be realized, and the same advantages as those of the first embodiment can be obtained.

Figure 14:
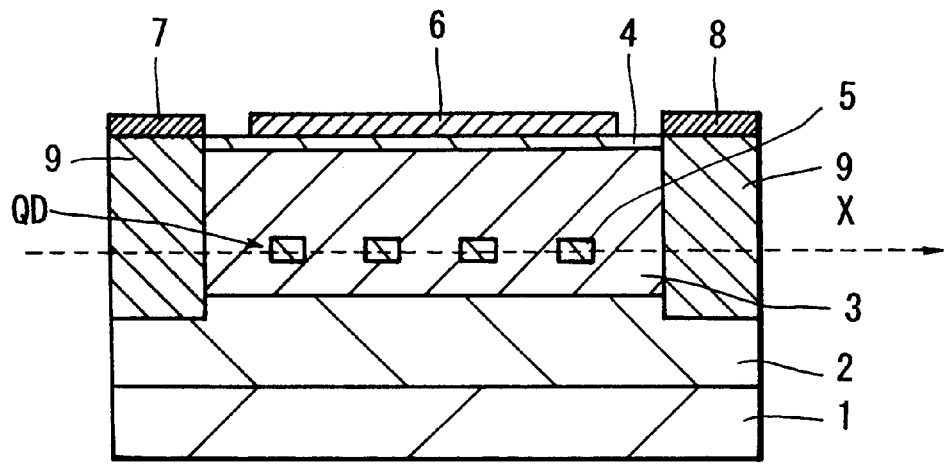
FIG. 14 is a cross-sectional view of a field effect transistor according to a fifth embodiment of the invention.

FIG. 14 shows a field effect transistor according to the fifth embodiment of the invention.

As shown in FIG. 14, in the field effect transistor according to the fifth embodiment, the AlGaAs layer 3 includes a single-stage two-dimensional quantum dot array of quantum dots QD on a planes parallel to the hetero interface between the GaAs layer 2 and the AlGaAs layer 3, which is embedded in a preset alignment pattern. Each of the quantum dots QD has a AlGaAs/InAs heterojunction structure in which an InAs layer 5 in form of a fine particle behaving as a quantum well portion is surrounded by the AlGaAs layer 3 as a barrier layer. In the other structural respects, the transistor according to the fifth embodiment is the same as the field effect transistor according to the first embodiment, and explanation thereof is omitted here.

Figure 15:
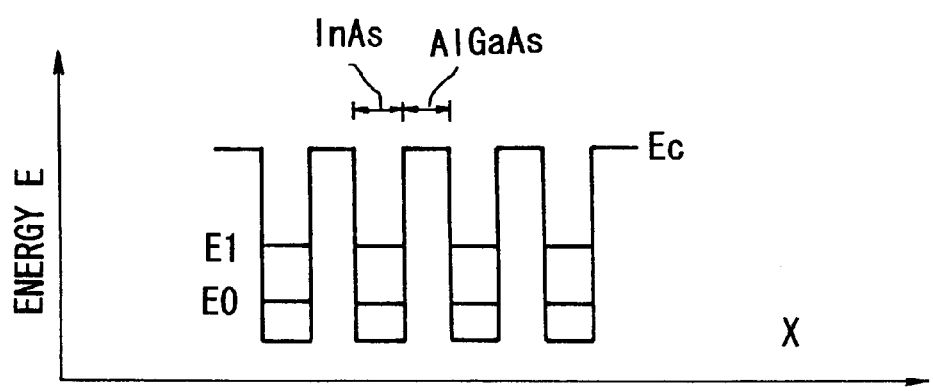
FIG. 15 is an energy band diagram for explaining operations of the field effect transistor according to the fifth embodiment of the invention.

In the field effect transistor according to the fifth embodiment, quantum levels are formed by size quantization in individual quantum dots QD forming the quantum dot array. Assume here that the ground level E0 and the first excited level E1 are formed in quantum dots QD as shown in FIG. 15. In FIG. 15, $E_c$ is the bottom energy of the conduction band (also in the subsequent text).

Figure 16:
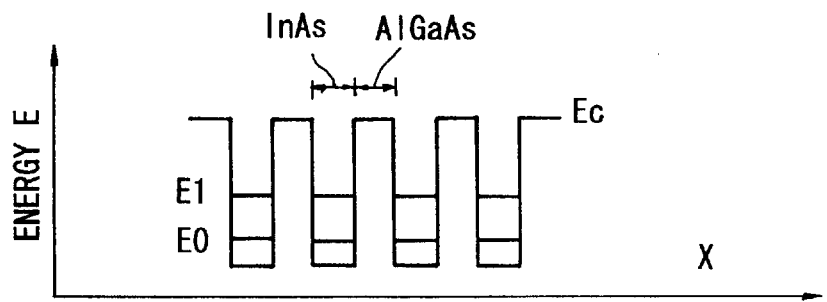
FIG. 16 is an energy band diagram for explaining operation of the field effect transistor according to the fifth embodiment of the invention.
Figure 17:
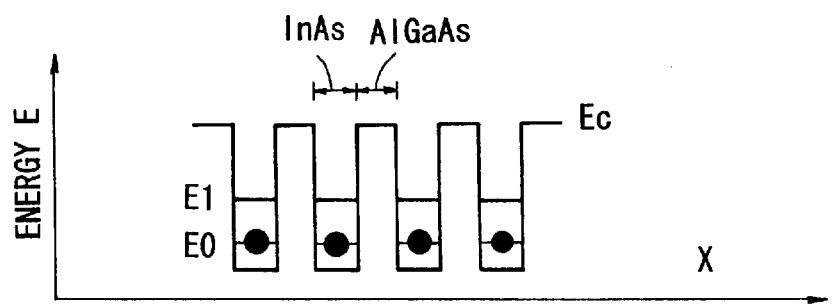
FIG. 17 is an energy band diagram for explaining operation of the field effect transistor according to the fifth embodiment of the invention.
Figure 18:
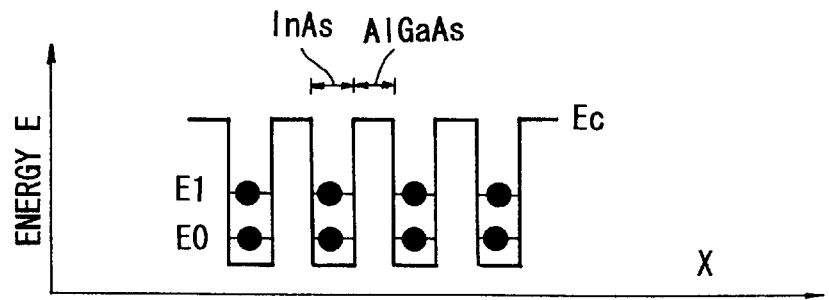
FIG. 18 is an energy band diagram for explaining operation of the field effect transistor according to the fifth embodiment of the invention.

In this case, by determining the state where both the ground level E0 and the first excited level E1 are empty (FIG. 16), the state where only the ground level E0 is occupied by electrons (FIG. 17) and the state where electrons occupy up to the first excited level E1 (FIG. 18) as "0", "1" and "2", respectively, three-value information can be stored.

When stored information is many-valued by using quantum levels in this manner, electrical charge stored in the quantum dots QD discretely changes relative to the voltage applied to the gate electrode 6 (gate voltage). Therefore, fluctuation in stored electric charge caused by application of the gate electrode can be alleviated. This results in decreasing the time for storing a desired amount of electric charge and hence decreasing the time for writing. That is, high-speed writing can be realized.

The field effect transistor according to the fifth embodiment can be fabricated in the same process as that of the first embodiment.

According to the fifth embodiment, a memory device capable of storing three-value information can be realized, and the same advantages as those of the first embodiment can be obtained.

Figure 19:
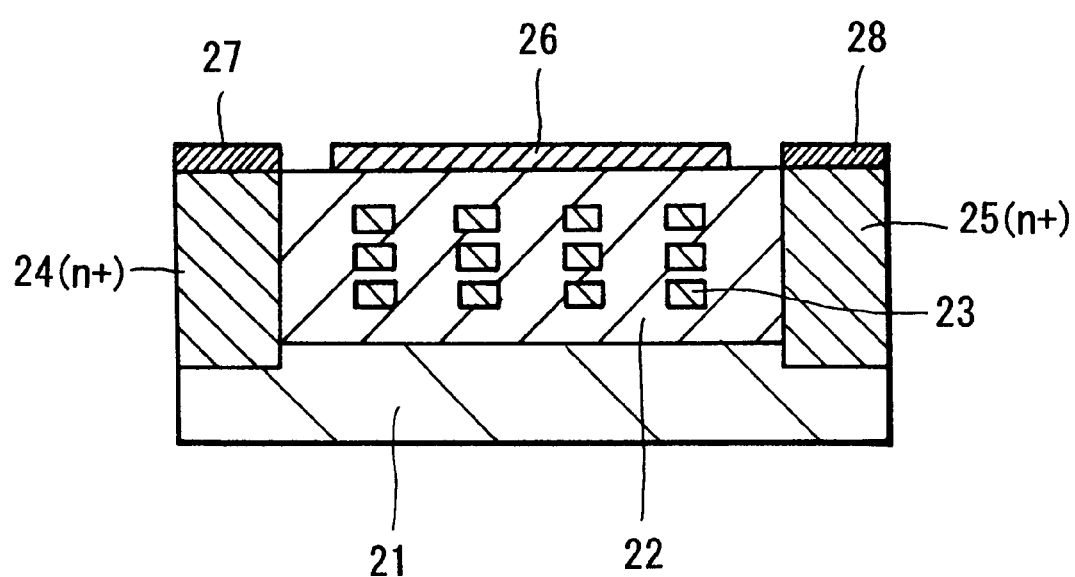
FIG. 19 is a cross-sectional view of a field effect transistor according to a sixth embodiment of the invention.

FIG. 19 shows a field effect transistor according to the sixth embodiment of the invention.

As shown in FIG. 19, the field effect transistor according to the sixth embodiment includes a $SiO_2$ film 22 on a Si substrate 21.

The SiO$_2$ film 22 includes, in its first, second and third planes parallel to the hetero interface between the Si substrate 21 and the SiO$_2$ film 22, a first-stage two-dimensional Au fine particle array, a second-stage two-dimensional Au fine particle array and a third-stage two-dimensional Au fine particle array, which all comprise Au fine particles 23 embedded in a common alignment pattern. These three stages of two-dimensional Au fine particle arrays form a three-dimensional Au fine particle array.

In this case, the distance between Au fine particles 23 in different adjacent two of the first, second and third stages in a direction normal to the hetero interface of the Si substrate 21 and the SiO$_2$ film 22, is set large enough, for example, 10 nm or less, to permit electrons to move between them by quantum-mechanical tunneling. The size of each Au fine particle 23 is set appropriately, depending on the intended use of the field effect transistor.

A source region 24 of an n$^+$-type, for example, and a drain region 25 are provided at opposite sides of the SiO$_2$ film 22. A source electrode 27 and a drain electrode 28 made of Al, for example, are provided on and in ohmic contact with the source region 24 and the drain region 25, respectively. A gate electrode 26 made of polycrystalline silicon doped with an impurity, for example, is provided on the SiO$_2$ film in a location between the source region 24 and the drain region 25 in alignment with the three-dimensional Au fine particle array.

The field effect transistor according to the sixth embodiment operates in the same manner as that of the first embodiment except that it stores electric charge in the Au fine particles 23.

Next explained is a method for fabricating the field effect transistor according to the sixth embodiment having the above-explained structure.

First made is the n$^+$-type source region 24 and the drain region 25 by selective ion implantation of an n-type impurity into the Si substrate. After that, the Si substrate 21 between the source region 24 and the drain region 25 is removed by etching up to a predetermined depth to form a groove, and a thin SiO$_2$ film 22 is formed on the Si substrate 21 in the groove by thermal oxidation, for example. Then, a thin Au film is formed on the SiO$_2$ film 22 by vacuum evaporation, for example, and then condensed by annealing to form the first-stage two-dimensional Au fine particle array. After that, a thin SiO$_2$ film 22 is formed on the first-stage two-dimensional Au fine particle array by CVD, for example, and the second-stage two-dimensional Au fine particle array is formed in the same manner. After that, a thin SiO$_2$ film is formed on the second-stage two-dimensional Au fine particle array by CVD, for example, and the third-stage two dimensional Au fine particle array is formed in the same manner. Then, a thin SiO$_2$ film is formed on the third-stage two-dimensional Au fine particle array by CVD, for example. The final SiO$_2$ film 22 is made to substantially flush with the source region 24 and the drain region 25. After that, a polycrystalline Si film is formed on the entire surface by CVD, and an impurity is doped into the polycrystalline Si film to decrease its resistance. Then, the polycrystalline Si film is patterned into the gate electrode 26 by etching. Finally, a metal film, e.g. Al film, is formed on the entire surface by vacuum evaporation or sputtering, and patterned into a predetermined configuration by etching to form the source electrode 27 and the drain region 28.

According to the sixth embodiment, a field effect transistor by Si, namely Si MOSFET, can make a memory device having various advantages like those of the first embodiment.

Having described a specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, Although the first embodiment uses a three-dimensional quantum dot array including two-dimensional quantum dot arrays in three stages, and the second embodiment uses a three-dimensional quantum dot array including two-dimensional quantum dot arrays in five stages, the number of stages of two-dimensional quantum dot arrays forming the three-dimensional quantum dot array is not limited to these examples, and may be set appropriately. The same applies also to the third, fourth and sixth embodiments.

Quantum dots need not be aligned in a common pattern in all two-dimensional quantum dot arrays forming the three-dimensional dot array, and two-dimensional quantum dot arrays may have different patterns of quantum dots.

The fifth embodiment has been described as using the ground level E0 and the first excited level E1 formed in quantum dots QD to store three-value information. However, one or more excited levels with higher energies may be made in quantum dots QD in addition to the ground level E0 and the first excited level E1 to store four-value or larger many-value information by using these quantum levels.

Although the first to fifth embodiments use quantum dots QD1 through QD6 or QD made of AlGaAs/InAs heterojunction, these quantum dots may be made of heterojunction of other appropriate compound semiconductors. The sixth embodiment may use polycrystalline Si fine particles, for example, in lieu of Au fine particles 23.

In the first embodiment, for example, the gate electrode 6 may be made in a recess structure to control the threshold voltage Vth. That is, the GaAs cap layer 4 may be processed by recess etching to form a recess and to form the gate electrode 6 in the recess. The same applies alto to the second to fifth embodiments.

The fourth embodiment electrically stores electric charge in quantum dots QD1 and QD2. However, electric charges may be stored optically, that is, by irradiating light to generate electron-hole pairs. In this case, the gate electrode 6 is preferably made of a transparent electrode material, such as ITO, to introduce light from above the gate electrode 6. Optical storage of electric charge enables optical writing of information and collective input of image information.

The manufacturing process explained with the first embodiment is only an example, and any other appropriate process may be employed. The same applies also to the process explained with the sixth embodiment.

As described above, according to the invention, since the electronic device controls the electrical conductivity of the conductive region by controlling distribution of electrons in the three-dimensional assembly of fine particles, the invention realizes a memory device which enables high-speed writing and reading of information with a low power consumption, storage of a plurality of bits of information, and high integration.

Additionally, since the electronic device controls the electrical conductivity of the conductive region by controlling the state of occupation by electron in a plurality of quantum levels formed in fine particles, the invention realizes a memory device which enables high-speed writing and reading of information with a low power consumption, storage of many-value information, and high integration.

What is claimed is:

1. An electronic device comprising:

a conductive region; and a three-dimensional assembly of fine particles adjacent said conductive region, wherein said three-dimensional assembly is comprised of a plurality of layers of two-dimensional arrays of fine particles;

said conductive region being controlled in electric conductivity by controlling distribution of electrons in said three-dimensional assembly of fine particles.

2. The electronic device according to claim 1 further comprising a control electrode adjacent a side of said three-dimensional assembly of fine particles opposite a side of the conductive region, said three-dimensional assembly of fine particles being controlled in distribution of electrons by a voltage applied to said control electrode.

3. The electronic device according to claim 1 wherein a difference in distribution of electrons in said three-dimensional assembly of fine particles is detected through a difference in electric conductivity of said conductive region.

4. The electronic device according to claim 1 wherein said three-dimensional assembly of fine particles includes a plurality of two-dimensional arrays of fine particles wherein patterns of particles in the respective arrays are aligned with particles of adjacent two-dimensional arrays.

5. The electronic device according to claim 4 wherein a distance between fine particles in a direction normal to an interface between said conductive region and said three-dimensional assembly of fine particles is set to a value permitting electrons to move between said fine particles by quantum-mechanical tunneling.

6. The electronic device according to claim 4 wherein a distance between fine particles in a direction normal to the interface between said conductive region and said three-dimensional assembly of fine particles is set to a value which is difficult for electrons to move between said fine particles by quantum-mechanical tunneling.

7. The electronic device according to claim 1 wherein said fine particles are made of a semiconductor.

8. An electronic device comprising:

a conductive region; and a three-dimensional assembly of fine particles adjacent said conductive region, said conductive region being controlled in electric conductivity by controlling distribution of electrons in said three-dimensional assembly of fine particle, wherein said three-dimensional assembly of fine particles includes a stack of a plurality of two-dimensional arrays of fine particles and wherein patterns of particles in the respective arrays are aligned with particles of adjacent two-dimensional arrays and further wherein said three-dimensional assembly of fine particles includes a plurality of three-dimensional sub-assemblies of fine particles which are arranged in a direction normal to an interface between said conductive region and said three-dimensional assembly of fine particles and each of said plurality of three-dimensional sub-assemblies of fine particles includes a plurality of said two-dimensional fine particle arrays, the distance between fine particles in each of said plurality of three-dimensional sub-assemblies of fine particles in said direction being set to a value permitting electrons to move between said fine particles by quantum-mechanical tunneling, and the distance from a peripheral fine particle in a three-dimensional sub-assembly of fine particles to an opposite peripheral fine particle in another three-dimensional sub-assembly of fine particles in a direction normal to the interface of said conductive region and said three-dimensional assembly of fine particles is set to a value such that it is difficult for electrons to move between these fine particles by quantum-mechanical tunneling.

9. An electronic device comprising:

a conductive region; and a three-dimensional assembly of fine particles adjacent said conductive region, said conductive region being controlled in electric conductivity by controlling distribution of electrons in said three-dimensional assembly of fine particles, wherein said fine particles are made of a metal.

10. An electronic device comprising:

a conductive region; and a two-dimensional assembly of fine particles in a close relation with said conductive region, said conductive region being controlled in electric conductivity by controlling the state of occupation by electrons in a plurality of quantum levels formed in said fine particles wherein said fine particles are comprised of a metal.

11. The electronic device according to claim 10 further comprising a control electrode formed over said two-dimensional assembly of fine particles, said two-dimensional assembly of fine particles being controlled in distribution of state of occupation by electrons in said quantum levels by a voltage applied to said control electrode.

12. The electronic device according to claim 10 wherein a difference in state of occupation by electrons in said quantum levels of said two-dimensional assembly of fine particles is detected through a difference in electric conductivity of said conductive region.

13. The electronic device according to claim 10 wherein said fine particles are made of a semiconductor.

14. An electronic device comprising:

a conductive region: and a two-dimensional assembly of fine particles in a close relation with said conductive region, said conductive region being controlled in electric conductivity by controlling the state of occupation by electrons in a plurality of quantum levels formed in said fine particles, wherein the mean energy difference between said quantum levels is larger than kT (where k is the Boltzmann constant, and T is the operation temperature expressed in absolute temperature).

15. An electronic device comprising:

a conductive region on a substrate;

a three-dimensional assembly of fine particles comprised of InAs on said conductive region;

a control electrode formed over said three-dimensional assembly of fine particles; and a pair of source and drain electrodes at opposite sides of said control electrode, said three-dimensional assembly of fine particles being surrounded by a barrier layer comprised of AlGaAs, and said conductive region being controlled in electric conductivity by controlling distribution of electrons in said three-dimensional assembly of fine particles.

16. An electronic device comprising:

a conductive region on a substrate;

a two-dimensional assembly of fine particles comprised of InAs on said conductive region;

a control electrode on said two-dimensional assembly of fine particles; and a pair of source and drain electrodes at opposite sides of said control electrode, said two-dimensional assembly of fine particles being surrounded by a barrier layer comprised of AlGaAs, and said conductive region being controlled in electric conductivity by controlling distribution of electrons in said two-dimensional assembly of fine particles.

* * * * *